(12) United States Patent
Nguyen et al.

(10) Patent No.: US 7,601,272 B2
(45) Date of Patent: Oct. 13, 2009

(54) METHOD AND APPARATUS FOR INTEGRATING METROLOGY WITH ETCH PROCESSING

(75) Inventors: Khiem K. Nguyen, San Jose, CA (US); Richard Lewington, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/561,995

(22) Filed: Nov. 21, 2006

(65) Prior Publication Data

US 2007/0097383 A1    May 3, 2007

Related U.S. Application Data

(63) Continuation-in-part of application No. 11/031,400, filed on Jan. 8, 2005, now abandoned.

(51) Int. Cl.
*G01L 21/30* (2006.01)
*B44C 1/22* (2006.01)
(52) U.S. Cl. .................. 216/59; 216/60; 216/67
(58) Field of Classification Search .............. 216/59, 216/60, 67
See application file for complete search history.

(56) References Cited

U.S. PATENT DOCUMENTS

| | | | |
|---|---|---|---|
| 4,447,731 | A | 5/1984 | Kuni et al. |
| 4,767,496 | A | 8/1988 | Hieber |
| 4,911,103 | A | 3/1990 | Davis et al. |
| 5,109,430 | A | 4/1992 | Nishihara et al. |
| 5,171,393 | A | 12/1992 | Moffat |
| 5,452,521 | A | 9/1995 | Niewmierzycki |
| 5,653,894 | A | 8/1997 | Ibbotsen et al. |
| 5,798,529 | A | 8/1998 | Wagner |
| 5,913,102 | A | 6/1999 | Yang |
| 5,926,690 | A | 7/1999 | Toprac et al. |
| 5,944,940 | A | 8/1999 | Toshima |
| 5,948,203 | A | 9/1999 | Wang |
| 5,963,329 | A | 10/1999 | Conrad et al. |
| 5,980,766 | A | 11/1999 | Flamm et al. |
| 6,001,699 | A | 12/1999 | Nguyen et al. |
| 6,004,706 | A | 12/1999 | Ausschnitt et al. |
| 6,007,675 | A | 12/1999 | Toshima |
| 6,027,842 | A | 2/2000 | Ausschnitt et al. |

(Continued)

FOREIGN PATENT DOCUMENTS

EP        0 727 715       8/1996

(Continued)

OTHER PUBLICATIONS

US 6,150,664, 11/2000, Su (withdrawn).

(Continued)

*Primary Examiner*—Shamim Ahmed
(74) *Attorney, Agent, or Firm*—Patterson & Sheridan, LLP

(57) ABSTRACT

An apparatus for integrating metrology and etch processing is disclosed. The apparatus comprises a multi-chamber system having a transfer chamber, an etch chamber and a metrology chamber, and a robot configured to transfer a substrate between the etch chamber and the metrology chamber. A method of processing a substrate and performing metrology measurement using this apparatus is also disclosed.

14 Claims, 6 Drawing Sheets

U.S. PATENT DOCUMENTS

| | | | |
|---|---|---|---|
| 6,033,814 | A | 3/2000 | Burdorf et al. |
| 6,054,710 | A | 4/2000 | Bruggeman |
| 6,060,022 | A | 5/2000 | Pang et al. |
| 6,124,212 | A | 9/2000 | Fan et al. |
| 6,129,807 | A | 10/2000 | Grimbergen et al. |
| 6,143,081 | A | 11/2000 | Shinriki et al. |
| 6,148,239 | A | 11/2000 | Funk et al. |
| 6,161,054 | A | 12/2000 | Rosenthal et al. |
| 6,166,509 | A | 12/2000 | Wyka et al. |
| 6,175,417 | B1 | 1/2001 | Do et al. |
| 6,178,239 | B1 | 1/2001 | Kishinsky et al. |
| 6,225,639 | B1 | 5/2001 | Adams et al. |
| 6,245,581 | B1 | 6/2001 | Bonser et al. |
| 6,313,596 | B1 | 11/2001 | Wyka et al. |
| 6,368,975 | B1 | 4/2002 | Balasubramhanya et al. |
| 6,388,253 | B1 | 5/2002 | Su |
| 6,411,389 | B1 | 6/2002 | Rushford |
| 6,413,147 | B1 | 7/2002 | Litvak |
| 6,413,867 | B1 | 7/2002 | Sarfaty et al. |
| 6,424,417 | B1 | 7/2002 | Cohen et al. |
| 6,424,733 | B2 * | 7/2002 | Langley ..................... 382/145 |
| 6,454,417 | B1 | 9/2002 | Takamoto et al. |
| 6,455,437 | B1 | 9/2002 | Davidow et al. |
| 6,479,309 | B1 | 11/2002 | Wright |
| 6,486,492 | B1 | 11/2002 | Su |
| 6,525,829 | B1 | 2/2003 | Powell et al. |
| 6,625,497 | B2 | 9/2003 | Fairbairn et al. |
| 6,689,519 | B2 | 2/2004 | Brown et al. |
| 6,707,544 | B1 | 3/2004 | Hunter et al. |
| 6,721,045 | B1 | 4/2004 | Hunter |
| 6,762,130 | B2 | 7/2004 | Laaksonen et al. |
| 6,811,370 | B2 | 11/2004 | Buermann |
| 6,961,626 | B1 | 11/2005 | Paik |
| 7,076,320 | B1 | 7/2006 | Phan et al. |
| 2001/0037994 | A1 | 11/2001 | Ezaki |
| 2001/0042845 | A1* | 11/2001 | van der Muehlen et al. ............... 250/559.29 |
| 2002/0072003 | A1 | 6/2002 | Brill et al. |
| 2002/0147960 | A1 | 10/2002 | Jevtic et al. |
| 2002/0155629 | A1 | 10/2002 | Fairbairn et al. |
| 2002/0160628 | A1 | 10/2002 | Okoroanyanwu et al. |
| 2002/0171828 | A1 | 11/2002 | Cohen et al. |
| 2003/0000922 | A1 | 1/2003 | Subramanian et al. |
| 2003/0045098 | A1 | 3/2003 | Verhaverbeke et al. |
| 2003/0045131 | A1 | 3/2003 | Verbeke et al. |
| 2003/0092281 | A1 | 5/2003 | Ramachandramurthy et al. |
| 2003/0228532 | A1 | 12/2003 | Mui et al. |
| 2004/0021097 | A1 | 2/2004 | Preece |
| 2004/0021856 | A1* | 2/2004 | Nishiyama et al. ....... 356/237.2 |
| 2004/0200574 | A1 | 10/2004 | Davis et al. |
| 2004/0203177 | A1 | 10/2004 | Davis et al. |
| 2005/0085090 | A1 | 4/2005 | Mui et al. |
| 2005/0207875 | A1 | 9/2005 | Kim |
| 2006/0154388 | A1 | 7/2006 | Lewington et al. |

FOREIGN PATENT DOCUMENTS

| | | |
|---|---|---|
| EP | 1 079 428 | 2/2001 |
| EP | 1 083 424 | 3/2001 |
| EP | 1496543 | 1/2005 |
| EP | 1496543 A | 1/2005 |
| JP | 61 290312 | 12/1986 |
| KR | 10-2003 0059634 | 7/2003 |
| KR | 10-2006 0053265 | 5/2006 |
| KR | 10-2006 0081365 | 7/2006 |
| WO | WO 01/09934 A1 | 2/2001 |
| WO | WO 01/84382 A1 | 11/2001 |
| WO | WO 02/09170 A2 | 1/2002 |
| WO | WO 02/37186 A1 | 5/2002 |
| WO | WO 03/003447 A2 | 1/2003 |
| WO | WO 2004/030050 | 4/2004 |

OTHER PUBLICATIONS

U.S. Appl. No. 10/754,321, filed Jan. 2004, Mak et al.
Yang, et al., "Line-Profile and Critical Dimension Measurements Using a Normal Incidence Optical Metrology System," Proceedings of SPIE vol. 4689, Mar. 2002.
Kota, et al., "Advanced Process Control for Polysilicon Gate Etching Using Integrated Optical CD Metrology", Proceedings of SPIE, vol. 5044 (2003) pp. 90-96.
Anthony J. Toprac, "AMD's Advanced Process Control of Poly-gate Critical Dimension", SPIE Conference on Process, Equipment and Materials Control in Integrated Circuit Manufacturing, Sep. 1999, Santa Clara, CA. SPIE, vol. 3882.
Lee, M.E., "Analysis of Reflectometry and Ellipsometry Data from Patterned Structures", Characterization and Metrology for ULSI Technology: 1998 International Conference, ed. D.G. Seiler, et al., 1998, pp. 331-335.
McIntosh, J.M., et al., "Approach to CD SEM Metrology Utilizing the Full Waveform Signal", Proceedings of the SPIE, vol. 3332, pp. 51-60, Feb. 23, 1998.
Ausschnit, Christopher P., et al., "Seeing the Forest for the Trees: A New Approach to CD Control," Ed. Bhanwar Singh, Proceeding of the SPIE, vol. 3332, pp. 212-220, Feb. 23-25, 1998.
Moharam, M.G., et al., "Stable Implementation of the Rigorous Coupled-Wave Analysis for Surface-Relief Gratings: Enhanced Transmittance Matrix Approach," Journal of the Optical Society of America, vol. 12, No. 5, pp. 1077-1086, May 1995.
Chateau, Nicolas, "Algorithm for the Rigourous Coupled-Wave Analysis of Grating Diffusion," Journal of the Optical Society of America, vol. 11, No. 4, pp. 1321-1331, Apr. 1994.
G.P. Kota, et al., "Integrated CD Metrology for Poly Si Etching", Lam Research Corporation, Plasma Etch Users Group Meeting, Jan. 17, 2002.
Raymond, Christopher J., "Angle-Resolved Scatterometry of Semiconductor Manufacturing", Microlithography World, Winter 2000, pp. 18-23.
Extended European Search Report dated May 3, 2006 for European Application No. 06250044.2-2222 (APPM/009296-EP).
Collard, et al. "Integrated phase shift measurements for advanced mask etch process control," Proceedings of the SPIE—The International Society for Optical Engineering SPIE-Int. Soc. Eng. USA, vol. 5256, 2003, pp. 76-84, XP002376855.
EP Search Report for 07022412, Jun. 16, 2008,copy consists of 4 unnumbered pages.
Extended European Search Report for EP07022412, Oct. 7, 2008, copy consists of 8 unnumbered pages.
Korean Office Action dated Feb. 24, 2009 for Application No. 10-2007-0118372.
Chinese Official Letter of Application No. 2007101877167 dated Dec. 26, 2008.
Prosecution History for U.S. Appl. No. 11/031,400.
Prosecution History for U.S. Appl. No. 11/532,195.

* cited by examiner

METHOD AND APPARATUS FOR INTEGRATING METROLOGY WITH ETCH PROCESSING

CROSS REFERENCE TO RELATED APPLICATIONS

This application is a continuation-in-part of, and claims priority to, commonly assigned U.S. patent application Ser. No. 11/031,400, entitled "Integrated Metrology Chamber for Transparent Substrates", filed on Jan. 8, 2005 now abandoned.

This application contains subject matter related to commonly assigned U.S. patent application Ser. No. 10/754,321, entitled "Integrated Phase Angle and Optical Critical Dimension Measurement Metrology for Feed Forward and Feedback Process Control", filed on Jan. 9, 2004. Both of these applications are herein incorporated by reference in their entirety.

BACKGROUND OF THE INVENTION

1. Field of the Invention

The invention relates to a method and apparatus of integrating a metrology tool in a multi-chamber process system. More particularly, the invention relates to a method and apparatus for integrating metrology measurements for etch process monitoring.

2. Background of the Related Art

The fabrication of microelectronics devices typically involves a complicated process sequence requiring hundreds of individual steps performed on semiconductive, dielectric and conductive substrates. Examples of these process steps include oxidation, diffusion, ion implantation, thin film deposition, cleaning, etching and lithography. Using lithography and etching (often referred to as pattern transfer steps), a desired pattern is first transferred to a photosensitive material layer, e.g., a photoresist, and then to the underlying material layer during subsequent etching. In the lithographic step, a blanket photoresist layer is exposed to a radiation source through a reticle or photomask containing a pattern so that an image of the pattern is formed in the photoresist. By developing the photoresist in a suitable chemical solution, portions of the photoresist are removed, thus resulting in a patterned photoresist layer. With this photoresist pattern acting as a mask, the underlying material layer is exposed to a reactive environment, e.g., using wet or dry etching, which results in the pattern being transferred to the underlying material layer.

The pattern on a photomask, which is typically formed in a metal-containing layer supported on a glass or quartz substrate, is also generated by etching through a photoresist pattern. In this case, however, the photoresist pattern is created by a direct write technique, e.g., with an electron beam or other suitable radiation beam, as opposed to exposing the photoresist through a reticle. With the patterned photoresist as a mask, the pattern can be transferred to the underlying metal-containing layer using plasma etching. An example of a commercially available photomask etch equipment suitable for use in advanced device fabrication is the Tetra™ Photomask Etch System, available from Applied Materials, Inc., of Santa Clara, Calif.

With ever-decreasing device dimensions, the design and fabrication of photomasks for advanced technology becomes increasingly complex, and control of critical dimensions and process uniformity becomes increasingly more important. Therefore, there is an ongoing need for improved process monitor and control in photomask fabrication.

SUMMARY OF THE INVENTION

One aspect of the present invention relates to an apparatus comprising a multi-chamber system comprising a transfer chamber, an etch chamber and a metrology chamber. A robot is provided inside the transfer chamber and configured to transfer a substrate between the etch chamber and the metrology chamber, The robot comprises a plate attached to a robot arm and a blade attached to the plate. The blade has at least one adjustable member for varying a position of the blade relative to the plate, and a perimeter portion defining an opening. The perimeter portion has support members for supporting the substrate at a predetermined height above the perimeter portion.

Another aspect of the invention relates to a method of processing a substrate. The method comprises providing a multi-chamber system comprising a transfer chamber, an etch chamber, a metrology chamber, and a metrology tool operatively coupled to the metrology chamber. A substrate, which may be square or rectangular shape, is processed in the etch chamber. The processed substrate is transferred to the metrology chamber using a robot provided inside the transfer chamber. At least one optical measurement is performed on the processed substrate using the metrology tool while the processed substrate is supported on a blade of the robot in a predetermined position inside the metrology chamber.

BRIEF DESCRIPTION OF THE DRAWINGS

A more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is also contemplated that elements of one embodiment may be advantageously incorporated in other embodiments without further recitation.

DETAILED DESCRIPTION

Figure 1:
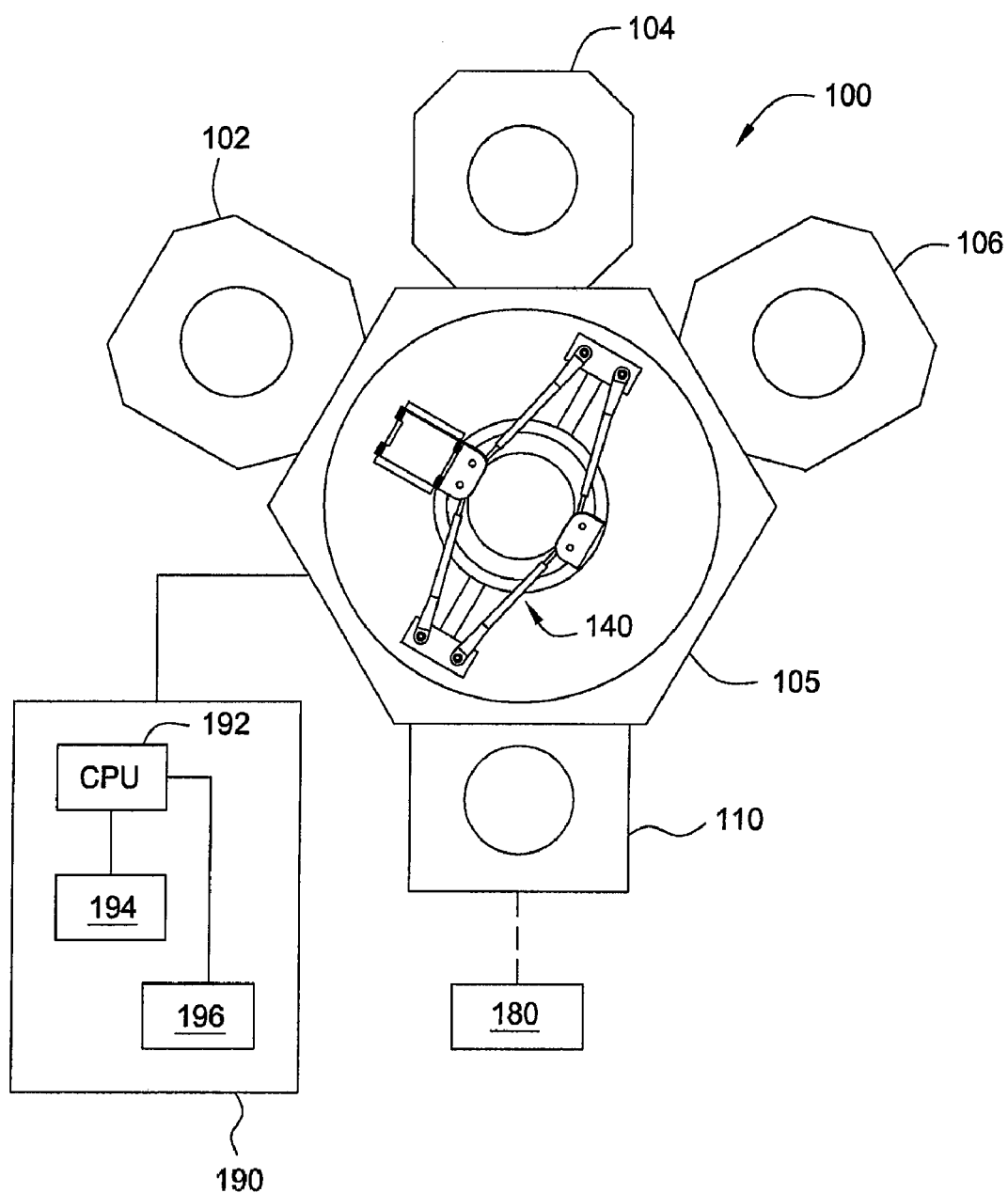
FIG. 1 is a schematic diagram showing a multi-chamber process system with an integrated metrology chamber.

The present invention relates to a method and apparatus for integrating a metrology tool with a multi-chamber process system (or cluster tool). By providing metrology capabilities in the cluster tool, process monitor and control can be greatly facilitated. FIG. 1 is a schematic diagram showing a top view of a multi-chamber process system or cluster tool 100 having a plurality of process chambers 102, 104, 106 and 110 disposed around a transfer chamber 105. The transfer chamber 105 is coupled to a vacuum system (not shown) for providing a reduced atmosphere condition.

According to one embodiment of the invention, one of the process chambers 110 is a metrology chamber, and another process chamber 104 is an etch chamber. The transfer chamber 105 houses a robot 140 that is used for transferring substrates to and from the chambers 102, 104, 106 and 110. The metrology chamber 110 is operatively coupled to a metrology tool 180, which performs measurements on a substrate inside the metrology chamber 110. For example, the metrology tool 180 can be used to perform optical measurements on a substrate that has been processed in the etch chamber 104. Information regarding substrate characteristics can be extracted from the optical measurements, and decisions can be made as to whether additional processing may be needed for that substrate, or whether the process conditions in the etch chamber should be adjusted. Although the integration of metrology with the etch chamber 104 is used as an example throughout this discussion, it is understood that metrology measurements can also be integrated with process monitoring and control with other process chambers, e.g., a deposition chamber used to deposit material on the substrate prior to etching in the chamber 104. The deposition chamber may be part of the system 100, or a separate processing system.

A system controller 190 is coupled to and controls each chamber or module of the multi-chamber system 100. Generally, the system controller 190 controls all aspects of operation of the system 100 using a direct control of chambers and apparatus of the system 100 or, alternatively, by controlling the computers associated with these chambers and apparatus. Furthermore, the controller 190 is also configured to communicate with a control unit associated with the metrology tool 180. For example, movements of the robot 140, transferring substrates to and from the process chambers 102, 104 and 106 and metrology chamber 110, performing process sequences, coordinating operations of the metrology tool 180 with various components of the multi-chamber system 100, and so on, are controlled by the system controller 190.

In operation, the system controller 190 enables feedback from the respective chambers and apparatus to optimize substrate throughput. The system controller 190 comprises a central processing unit (CPU) 192, a memory 194, and a support circuit 196. The CPU 192 may be one of any form of a general purpose computer processor that can be used in an industrial setting. The support circuit 196 is conventionally coupled to the CPU 192 and may comprise cache, clock circuits, input/output subsystems, power supplies, and the like. The software routines, when executed by the CPU 192, transform the CPU into a specific purpose computer (controller) 190. The software routines may also be stored and/or executed by a second controller (not shown) that is located remotely from the system 100.

Figure 2:
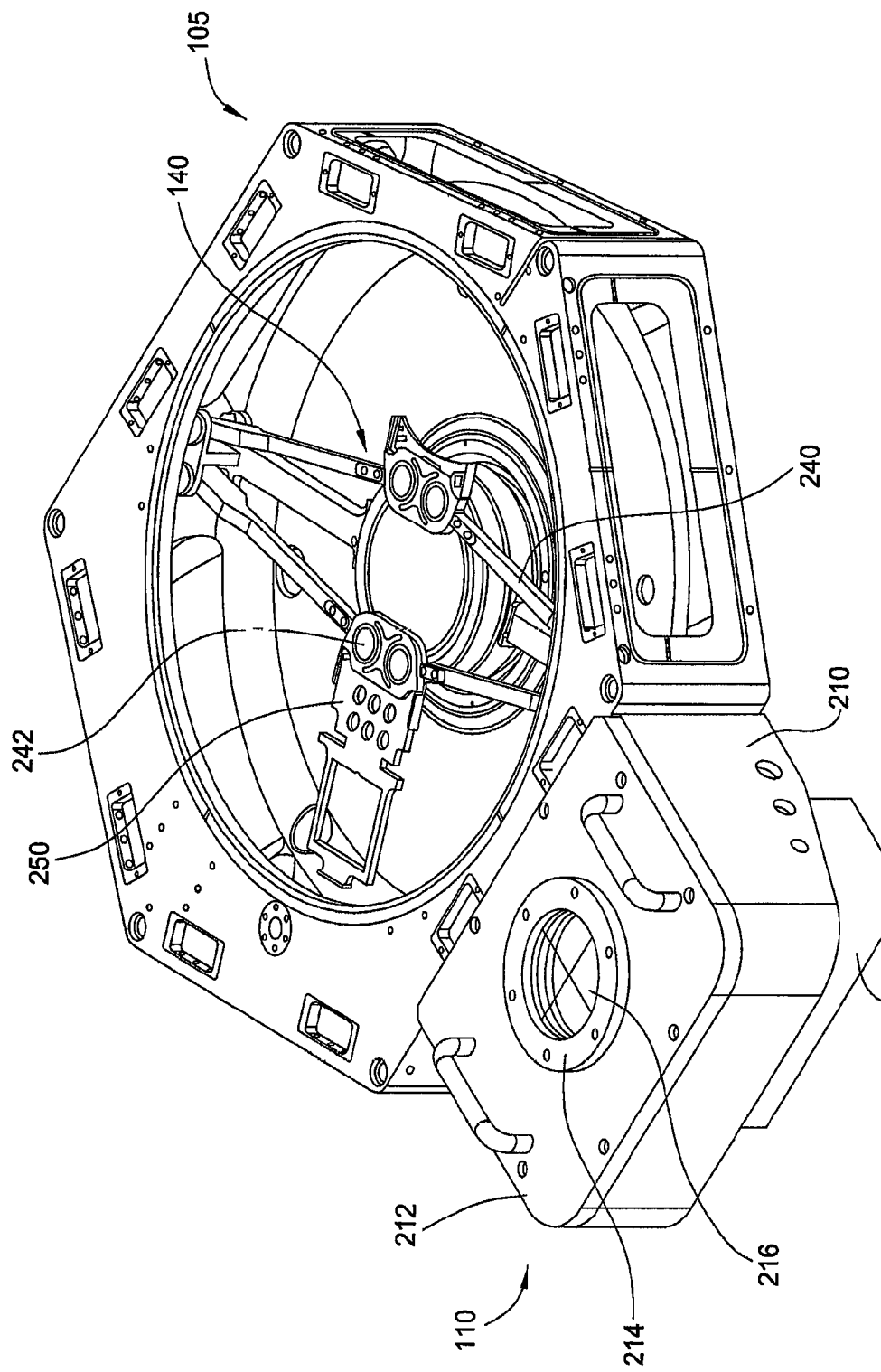
FIG. 2 is a schematic perspective view of a metrology chamber coupled to a transfer chamber.
Figure 3:
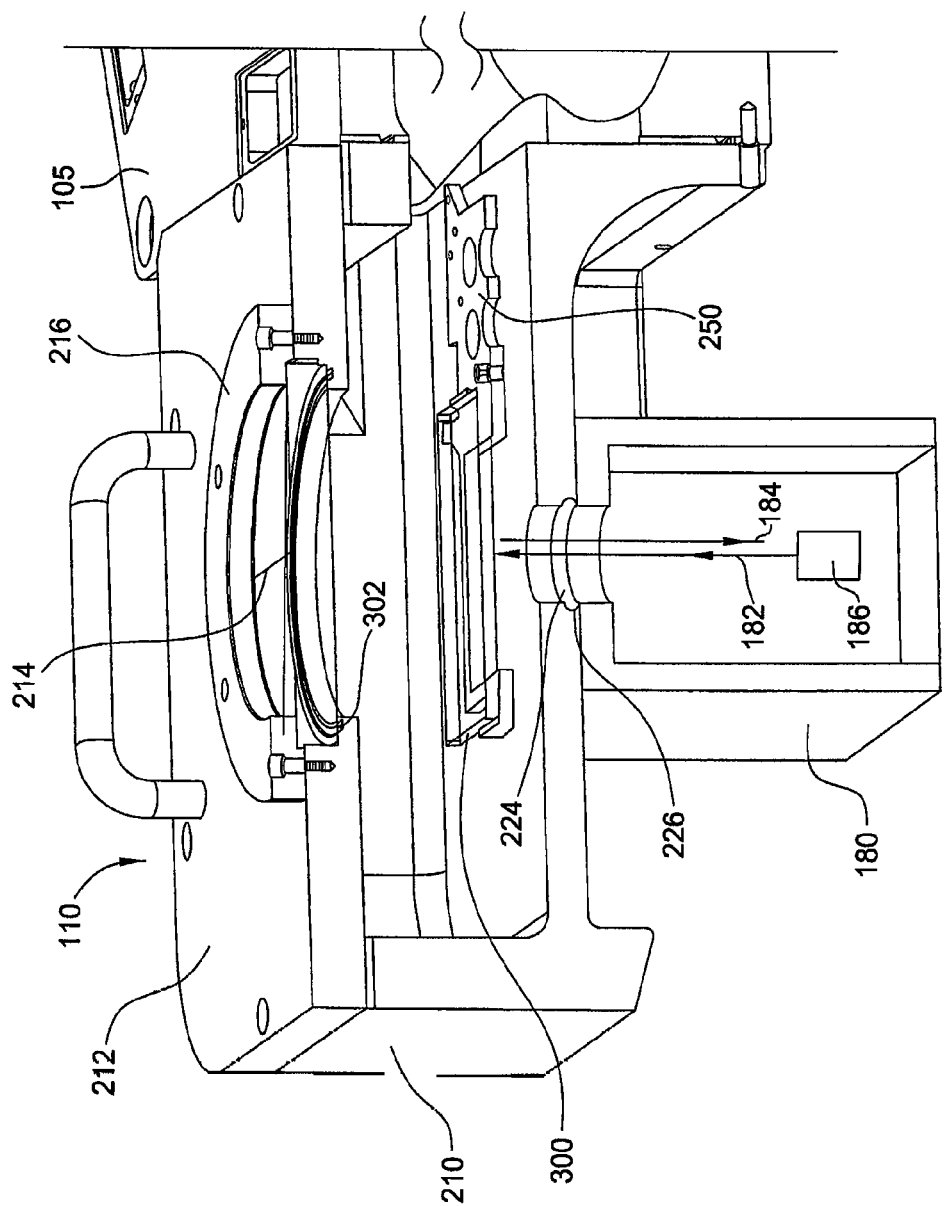
FIG. 3 is a schematic sectional view showing a substrate inside the metrology chamber of FIG. 2.

FIG. 2 is a schematic perspective view of the transfer chamber 105 coupled to the metrology chamber 110. The metrology chamber 110 comprises a chamber body 210 and a lid 212. A viewport or window 214 is provided on the lid 212 to allow optical access to the metrology chamber 110. The lid 212 has a groove with an O-ring disposed therein (groove 302 is shown in FIG. 3). The window 214 is secured to the lid 212 by a flange 216, with the O-ring providing a vacuum seal between the window 214 and the lid 212. The robot 140 shown in FIG. 2 is an example of a dual-blade robot, which has two robot arms 240, one of which, as shown, has a robot blade 250 attached to a wrist plate 242. According to one embodiment of the invention, the robot blade 250 is adapted for transferring a substrate to and from the various chambers, and also adapted for supporting the substrate inside the metrology chamber 110 for measurements to be performed.

During optical measurements of a substrate, the metrology chamber 110 and the transfer chamber 105 may be maintained under a common, reduced pressure condition. In one embodiment, the chambers are maintained at a pressure of about 200 mtorr. Other pressures may also be used, for example, less than about 1 torr, with a lower pressure limit of about 10 mtorr, as determined by the type of vacuum pump used for evacuation of the chambers. A partition (not shown), such as a door or a gate valve, may be provided between the transfer chamber 105 and the metrology chamber 110 so that the chambers can be isolated from each other, if desired. For example, when a substrate is being transferred to and from any of the process chambers 102, 104 or 106, it may be desirable to isolate the metrology chamber 110 from the transfer chamber, especially if the chamber atmosphere conditions are significantly different among the various chambers.

FIG. 3 is a schematic sectional view of the metrology chamber 110 showing the relative positions of the robot blade 250 and the substrate 300 with respect to the metrology tool 180. A viewport or window 224 is provided at the bottom of the metrology chamber body 210 for optical access. The window 224, which is made of fused silica or other suitable materials, is attached to the outside surface of the chamber body 210 by a flange 226. Similar to the top window 214, vacuum sealing between the window 224 and the chamber surface is achieved by use of an O-ring, or other suitable sealing material, disposed inside a groove on the surface the chamber body 210.

In one illustrative embodiment, the metrology tool 180 is used for optical measurements on a photomask substrate 300 that has been processed in the etch chamber 104. One example of a suitable metrology tool is an N&K photomask tool, which can perform measurements such as reflectance and/or transmittance, among others. Metrology tools from other manufacturers are also suitable for use in conjunction with the multi-chamber process system of this invention. While details of the metrology measurements and analyses depend on the specific metrology tool employed, the method generally proceeds as follows.

An incident optical beam 182 from the metrology tool 180 is directed inside the metrology chamber 110 through the bottom window 224, and focused (if appropriate) onto the substrate 300. Typically, one or more test patterns, e.g., comprising line/space structure that may or may not be periodic, are provided at different locations of the substrate. Preferably, each test pattern has dimensions larger than the incident beam size, and is also sufficiently large to take into account of positioning error from the robot. The spot size of the incident beam 182 varies with the specific application and type of measurement. For example, for quartz etching application, trench depth measurements can be performed with a beam size having a diameter of about 1 mm. For measurements with a 1 mm beam spot size, a placement repeatability of the substrate 300 of about 0.25 mm will be sufficient. The beam may be incident onto a test pattern or an area of the substrate 300 that has at least about 5% of feature coverage (i.e., not a blanket metal or quartz layer). For measurements of critical dimensions (CD) in a lateral or horizontal direction, a smaller beam size, e.g., about 50 μm, may be used. Furthermore, since CD measurements are typically done using interferometric methods, a test pattern having dimensions at least as large as the incident beam size is needed. A larger test pattern will facilitate the alignment and positioning procedure, and reduce the accuracy required for robot placement. For example, a suitable test pattern may be a square having a linear dimension from about 200 μm to about 5 mm.

With the substrate 300 supported by the robot blade 250 and positioned at a predetermined position inside the metrology chamber 110, the incident beam 182 is directed onto a suitable area of the substrate 300, e.g., a test pattern. A return beam 184, e.g., resulting from interactions between the incident beam 182 and the test pattern structure, is detected by a photodetector in the metrology tool 180. The return beam 184 may arise from beam reflections, diffractions, scattering, interferences, or combinations thereof, and the nature of the detected signals will vary according to the specific film structures and test patterns.

Results are usually analyzed by software, e.g., one that is associated with the metrology tool, to obtain information relating to substrate characteristics such as critical dimension, layer thickness, etch depth, phase shift, and so on. In certain situations, one or more measurement performed at one location of the substrate 300 may suffice for process monitoring purposes. Alternatively, the substrate 300 can be moved by the robot 140 to other predetermined positions to allow for additional measurements to be performed at various locations of the substrate 300. These additional measurements, for example, can provide information regarding process uniformity. Based on these results, determinations can be made regarding the need for any process control or parameter adjustments. For example, the measured substrate characteristic or process result such as center to edge uniformity (in x/y direction) can be compared with a reference to decide whether it is within acceptable limits, and whether the substrate should be returned to the etch chamber for further processing. Alternatively, if the result is not satisfactory, one may also change one or more process conditions in the etch chamber before another substrate is processed.

Although the incident beam 182 of the metrology tool 180 is shown as being coupled into the metrology chamber 110 through the bottom window 224, thus providing measurements from the backside of the substrate 300, one can also couple the beam 182 through the top window 214 to incident on the top of the substrate 300 for other measurements. In addition, measurements can also be done in a transmission mode—i.e., monitoring light that is transmitted through portions of the substrate 300, instead of operating in the reflective mode as illustrated in FIG. 3. The light source used for transmission measurement may either be ambient light, the beam 182 from the metrology tool 180, or another light source.

In general, the metrology tool 180 also has a control unit 186 for controlling the operation of the tool, e.g., implementing metrology measurements, acquiring and storing data, analyzing results, and so on. This control unit 186 may be configured to communicate with the system controller 190 to allow various operations to be performed in a coordinated fashion.

Figure 4A:
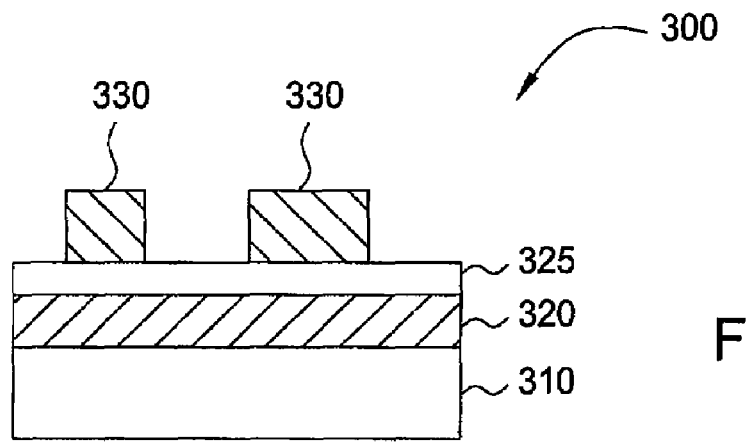
FIG. 4A-4B are schematic cross-sectional views of a structure of a photomask substrate during fabrication.
Figure 4B:
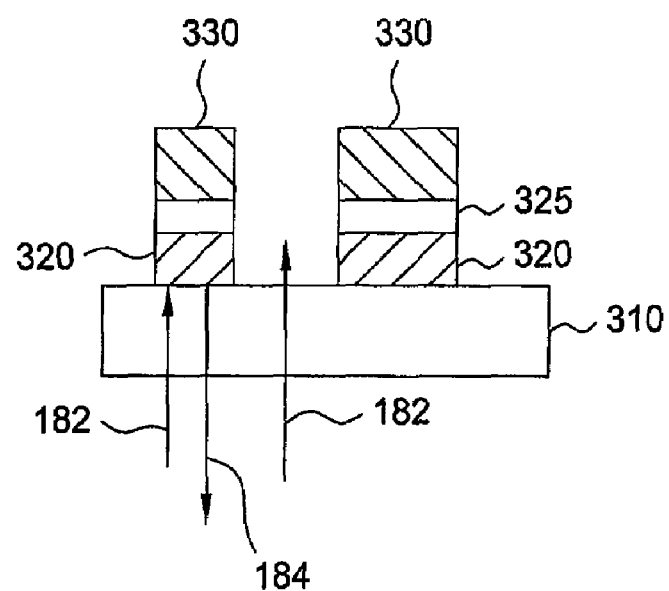

FIG. 4A-4B are schematic cross-sectional views of a structure of a photomask substrate during fabrication. The photomask substrate 300 comprises a silicon oxide-containing layer 310, a metal-containing layer 320, and a patterned photoresist layer 330. The silicon oxide-containing layer 310 is typically a glass or quartz (fused silica) plate, which is transparent to UV radiation wavelengths from various lithographic tools. The metal-containing layer 320 may generally be a chromium-containing or molybdenum-containing layer, or it may include other metals suitable for use in a photomask. Examples of materials that may be used in the metal-containing layer 320 include chromium, chromium oxide, chromium oxynitride, molybdenum, molybdenum silicide, molybdenum tungsten silicide, among others, and combinations thereof. An anti-reflective layer (ARC) 325 is often provided between the metal-containing layer 320 and the photoresist layer 330 to improve the lithographic process. The photoresist layer 330 may comprise a variety of photoresist materials suitable for use with various lithographic techniques or tools that are known to one skilled in the art. Typically, the metal-containing layer 330 may have a thickness between about 250 Å to about 1000 Å, the ARC layer may have a thickness from about 250 Å to about 550 Å, while the thickness of the photoresist layer may range from about 2000 Å to about 5000 Å. Although the metal-containing layer 320 is shown as a single layer in FIG. 4A, in general, depending on the specific mask that is being fabricated, one can also have multiple films or layers of different materials.

The pattern in the photoresist layer 330 is transferred to the underlying ARC layer 325 and the metal-containing layer 320 by exposing the structure of FIG. 4A to a reactive environment inside the etch chamber 104. For example, plasmas of etching gases such as chlorine-containing gases (e.g., $Cl_2$) or fluorine-containing gases (e.g., $SF_6$ or $CF_4$), oxidizing gases such as oxygen, and inert gases, such as helium, may be used for etching the metal-containing layer 320. Appropriate endpoint detection schemes can be used to monitor the etching of the metal-containing layer 320. Depending on the specific application, the etch process may be stopped as soon as the underlying silicon oxide-containing layer 310 is exposed, as shown in FIG. 4B, or the etching can proceed to some predetermined depth in the silicon oxide-containing layer 310, as may be required for certain types of phase shift masks.

While the monitoring and control of the etch process may be done using in-situ endpoint detection during etching of the photomask substrate 300, ex-situ measurement in the integrated metrology chamber offers expanded metrology capabilities that may not be readily incorporated into the etch chamber environment. For ex-situ measurements, the robot blade 250 transports the substrate 300 from the etch chamber 104, and supports and properly positions it inside the metrology chamber 110. The robot blade 250 is designed to allow positioning of the substrate 300 with respect to the metrology tool 180, and more specifically, with sufficient precision to allow alignment between the incident beam 182 and a test pattern on the substrate 300 so that metrology measurements can be performed while the substrate 300 is supported by the robot blade 250. For example, aside from lateral positioning of the substrate 300, the robot 140 is also configured to provide height and/or leveling adjustments of the robot blade 250, and height and/or leveling of the mask substrate 300 via one or more adjustable members.

Figure 5A:
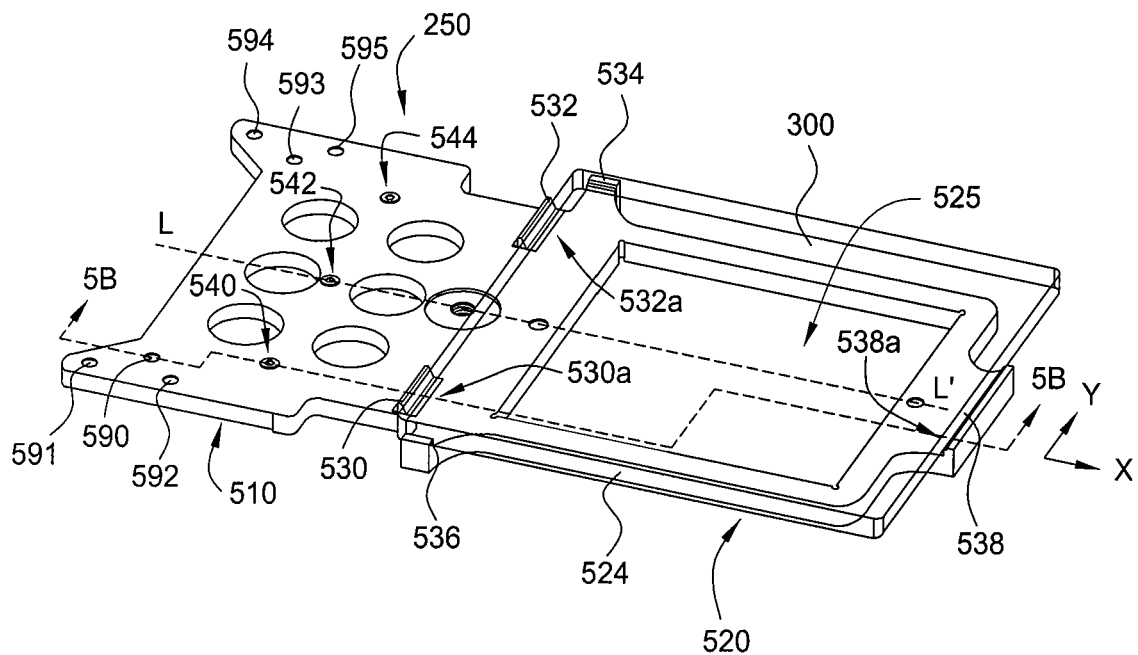
FIG. 5A is a schematic illustration of a robot blade suitable for use in one embodiment of the present invention.
Figure 5B:
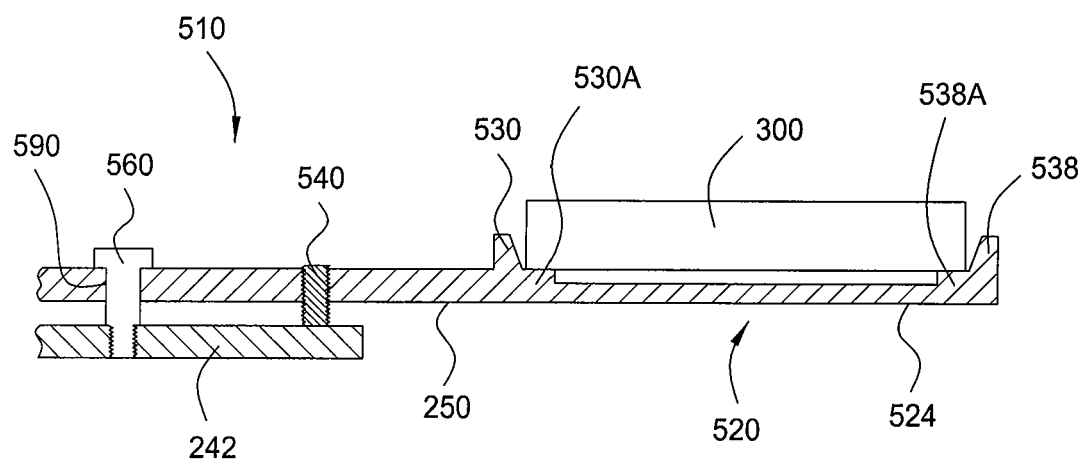
FIG. 5B is a schematic partial sectional view of the robot blade of FIG. 5A.

FIG. 5A is a schematic illustration of one embodiment of the robot blade 250 suitable for implementing the present invention, and FIG. 5B is a partial sectional view (indicated by dashed line 5B-5B) showing the substrate 300 supported by the robot blade 250. The robot blade 250 has a first end 510 for attaching to a wrist plate 242 of the robot 140, and a second end 520 for supporting a photomask substrate 300, or more generally, a substrate having a square or rectangular shape. Specifically, the second end 520 of the robot blade 250 has a perimeter portion 524 defining an opening 525, e.g., a horizontal frame in the x-y plane, with a number of protruding portions for keeping the substrate 300 in position (laterally) in the x-y plane. The embodiment of FIG. 5A shows five protruding portions 530, 532, 534, 536 and 538 for maintaining the substrate 300 in a predefined orientation relative to the blade 250. As shown in FIG. 5B, protruded portions 530 and 538 extend upwards from the blade 250 and bound two sides of the substrate 300. Other arrangements or designs of the horizontal frame and protruding portions are also possible, including, for example, two L-shaped protruding portions (not shown) disposed at two corners of the horizontal frame 524.

FIG. 5B also shows the substrate 300 being supported on steps 530A and 538A adjacent to protruded portions 530 and 538, respectively. Another step 532a, provided adjacent to protruded portion 532 (see FIG. 5A), also serves as a support surface for the mask 300. Other variations such as the number of steps or location around the perimeter portion 524 are acceptable, although the steps should contact the substrate 300 at its periphery. In one embodiment, the robot blade 250 is designed with a step height and dimensions suitable for supporting a substrate 300 that is 6 inches by 6 inches square and about 0.25 inches thick. It is understood that the blade dimensions can be modified to accommodate photomasks of other dimensions.

Different mechanisms can be used for adjusting positions of the robot blade 250 and the substrate 300 supported thereon. In the illustrative embodiment of FIG. 5A, adjustable members, e.g., set screws 540, 542 and 544, are provided for adjusting the height and leveling of the robot blade 250. As shown in FIG. 5B, the set screw 540 is disposed inside a threaded hole of the robot blade 250 and has one end protruding through the bottom of the blade 250 and resting against a top surface of the wrist plate 242. Adjustment of the set screw 540 (along with set screws 542, 544 in FIG. 5A) allows the height and leveling of the robot blade 250 to be set to desired positions relative to the wrist plate 242, after which, the robot blade 250 can be secured or attached to the wrist plate 242 of the robot arm 240 using a number of bolts, one of which is shown as bolt 560. The bolt 560 fits through a clearance hole 590 on the first end 510 of blade 250, and is threaded to a threaded hole on the wrist plate 242. As shown in FIG. 5A, additional clearance holes 591, 592, 593, 594 and 595 are provided on the blade 250 with corresponding threaded holes on the wrist plate 242 to accommodate other bolts. In one embodiment, six bolts are used for securing the blade 250 onto the wrist plate 242, although other variations (e.g., different number and location of bolts) are also acceptable. Preferably, the bolts are provided in pairs disposed symmetrically with respect to a central longitudinal axis LL' (along the x-direction) of the blade 250, e.g., at clearance holes 590 and 593; 591 and 594; or 592 and 595.

In general, prior to operation of the metrology chamber, the robot blade 250 is adjusted to provide proper alignments (height/distance as well as leveling) within the tolerance necessary for various optical measurements to be performed on the substrate 300. For example, the height of the blade 250 with respect to the wrist plate 242 can be adjusted using one or more set screws 540, 542 and 544, while the rotation or leveling about the central longitudinal axis LL' of the blade 250 can be adjusted using set screws 540 or 544, which are disposed on opposite sides of the longitudinal axis LL'.

The substrate 300 is supported by the steps (e.g., 530A, 532A and 538A) of the perimeter portion 524. In one embodiment, the blade 250 can be adjusted in height up to about 0.12 in. (about 3 mm) relative to the wrist plate 242, with a tilt angle of the end of the blade up to about 15 degrees with respect to the x/y plane defined by the plane of the wrist plate 242. For purpose of leveling the substrate with respect to the optical beam, an accuracy of about 0.005 in. in the height adjustment (e.g., by the set screws) is sufficient for most metrology measurements. Although the adjustments of the height and tilt for the robot blade 250 and the substrate 300 are performed manually in the illustrated embodiment, they can also be automated, if desired, by providing motorized controls via the CPU 192.

In the example of FIG. 3, a fused silica window 224 of the metrology chamber 110 allows an optical beam 182 from the metrology tool 180 to be directed onto the substrate 300. As shown in FIG. 4B, a part of the incident optical beam 182, after traversing the quartz layer 310, is reflected back by the metal-containing layer 320 as part of a return beam 184. Other parts of the incident beam 182 may reflect, scatter, or diffract off other parts of the structure on the substrate 300, forming parts of the return beam 184, which is detected by a photodetector (not shown) of the metrology tool 180. Based on results of the optical measurements, substrate characteristics such as critical dimension, etch depth, phase shift, and so on, can be determined. If the characteristics are found to be outside certain predetermined limits, the mask may be transferred to the etch chamber for additional processing, the process conditions may be adjusted as needed or other remedial action taken. The system controller 190 is used to control and coordinate the overall operation of the metrology tool 180 and the various components of the multi-chamber process system 100.

Figure 6:
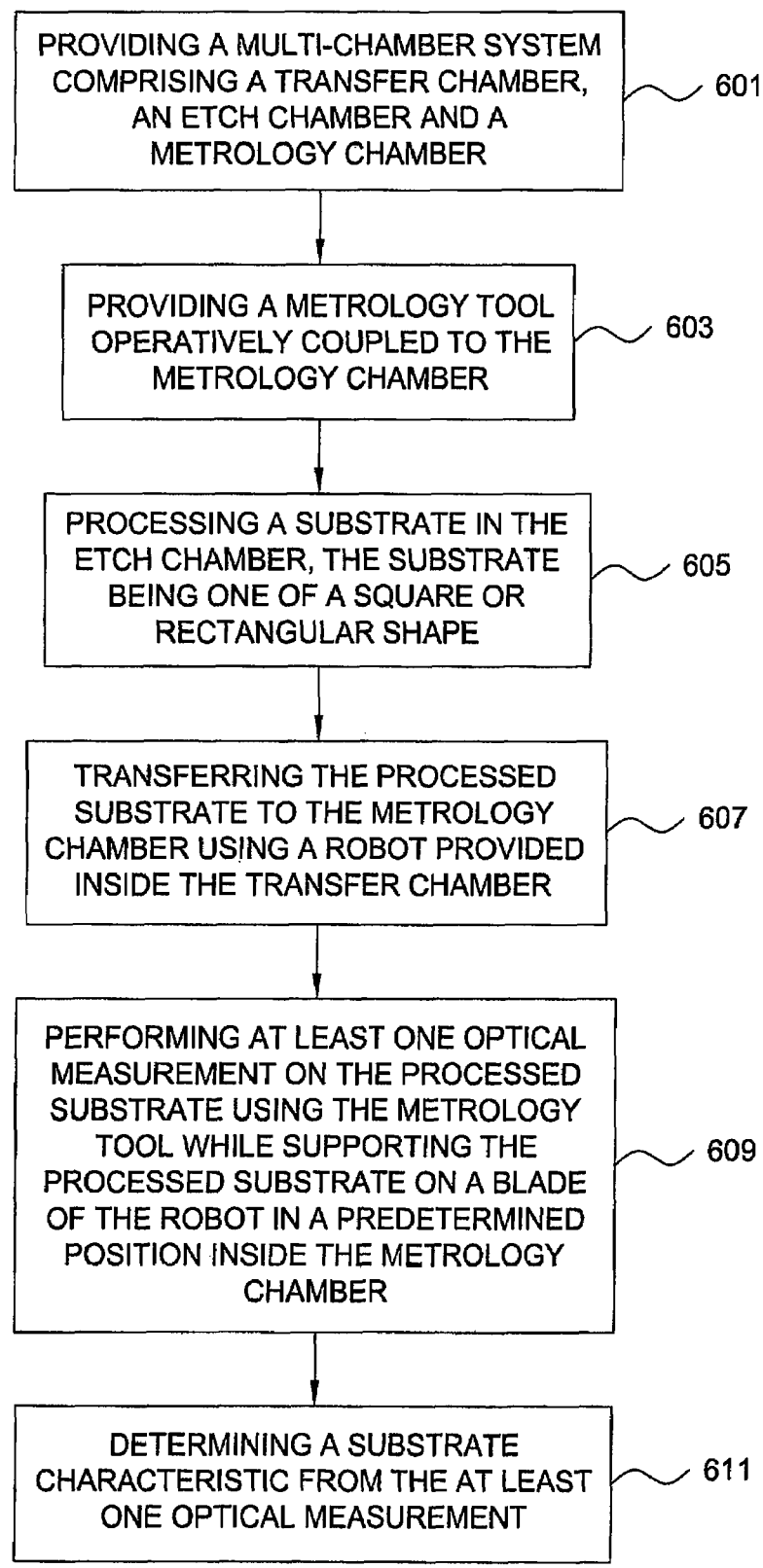
FIG. 6 illustrates a method that can be practiced using the apparatus of the present invention.

FIG. 6 illustrates steps in a method that can be implemented using the apparatus of the present invention. In step 601, a multi-chamber system comprising a transfer chamber, a process chamber, and a metrology chamber is provided. In step 603, a metrology tool is operatively coupled to the metrology chamber. After a square or rectangular shape substrate is processed in the process chamber (step 605), it is transferred to the metrology chamber using a robot provided inside the transfer chamber (step 607). In step 609, at least one optical measurement is performed on the substrate using the metrology tool while the processed substrate is supported by a blade of the robot in a predetermined position inside the metrology chamber. In step 611, a substrate characteristic is determined from the at least one optical measurement. Depending on the specific processing needs, additional method steps or variations may be implemented for process monitoring or control using the apparatus disclosed herein.

While the foregoing is directed to the preferred embodiment of the present invention, other and further embodiments of the invention may be devised without departing from the basic scope thereof, and the scope thereof is determined by the claims that follow.

The invention claimed is:

1. A method of processing a substrate, comprising:
    (a) providing a multi-chamber system comprising a transfer chamber, an etch chamber and a metrology chamber;
    (b) providing a metrology tool operatively coupled to the metrology chamber;
    (c) processing a substrate in the etch chamber, the substrate being one of a square or rectangular shape;
    (d) transferring the processed substrate to the metrology chamber using a robot provided inside the transfer chamber;
    (e) performing at least one optical measurement on the processed substrate using the metrology tool disposed in the metrology chamber while supporting the processed substrate on a blade of the robot in a predetermined position inside the metrology chamber; and
    (f) determining a substrate characteristic from the at least one optical measurement, wherein the substrate characteristic includes one of critical dimension, etch depth, layer thickness, or phase shift.

2. The method of claim 1, further comprising:
    (g) maintaining the metrology chamber and the transfer chamber under reduced pressure conditions throughout steps (d) and (e).

3. The method of 1, wherein the substrate comprises one of a silicon oxide-containing layer, a metal-containing layer or a photoresist layer.

4. The method of 3, wherein the silicon oxide-containing layer is quartz.

5. The method of 3, wherein the metal-containing layer comprises one of chromium, chromium oxide, chromium oxynitride, molybdenum, molybdenum silicide, molybdenum tungsten silicide, or combinations thereof.

6. The method of 1, wherein step (e) further comprises:
   (e1) directing an incident optical beam from the metrology tool onto the processed substrate; and
   (e2) detecting a return optical beam from the processed substrate.

7. The method of 6, further comprising, prior to step (e), adjusting an orientation of the substrate to allow the incident optical beam to be directed to a test pattern on the substrate and the return optical beam to be detected by the metrology tool.

8. The method of 1, further comprising:
   (g) providing a controller in communication with the multi-chamber system and the metrology tool;
   (h) sending instructions from the controller to the multi-chamber system in response to information obtained from the optical measurement.

9. The method of 1, further comprising:
   (g) comparing the substrate characteristic determined in (f) to a reference; and
   (h) based on result from (g), performing one of:
      (h1) transferring the processed substrate to the etch chamber for additional processing; or
      (h2) changing at least one process condition in the etch chamber prior to processing another substrate.

10. A method of processing a photomask substrate, comprising:
    (a) providing a photomask substrate into a multi-chamber system comprising an etch chamber and a metrology chamber, the photomask substrate comprising a silicon oxide-containing layer and a metal-containing layer, wherein the metal-containing layer comprises chromium and/or molybdenum;
    (b) transferring the substrate to an etch chamber on a robot blade disposed in the multi-chamber system;
    (c) etching the metal-containing layer in the etch chamber;
    (d) transferring the etched substrate into the metrology chamber on the robot blade,
    (e) supporting the substrate inside the metrology chamber while performing at least one optical measurement on the etched substrate;
    (f) determining a substrate characteristic from the at least one optical measurement, wherein the substrate characteristic includes one of critical dimension, etch depth, layer thickness, or phase shift; and
    (g) returning the measured substrate to the etch chamber for further etching.

11. The method of claim 10 further comprising:
    (h) determining if the measured substrate characteristic has reached to a predetermined reference.

12. The method of claim 11, wherein supporting further comprises:
    aligning a test pattern disposed on the etched substrate with a beam in the metrology chamber utilized to perform measurement.

13. The method of claim 10, wherein supporting the substrate inside the metrology chamber further comprises:
    supporting the substrate on a robot blade while performing the at least one optical measurement.

14. The method of claim 13, further comprising:
    moving the substrate supported on the robot blade while performing the at least one optical measurement.

* * * * *